United States Patent
Oh et al.

(10) Patent No.: US 6,882,233 B2
(45) Date of Patent: Apr. 19, 2005

(54) VARIABLE OSCILLATION FREQUENCY RESONANCE CIRCUIT AND VOLTAGE CONTROLLED OSCILLATOR USING THE SAME

(75) Inventors: Seung Min Oh, Kyungki-do (KR); Hyo Seok Kwon, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 26 days.

(21) Appl. No.: 10/461,436

(22) Filed: Jun. 16, 2003

(65) Prior Publication Data

US 2004/0196111 A1 Oct. 7, 2004

(30) Foreign Application Priority Data

Apr. 1, 2003 (KR) ................................. 10-2003-0020392

(51) Int. Cl.[7] .................................................. H03B 5/12
(52) U.S. Cl. ............................... 331/117 R; 331/36 C; 331/117 FE; 331/177 V; 331/179
(58) Field of Search ..................... 331/36 C, 117 R, 331/117 FE, 117 D, 177 R, 177 V, 179

(56) References Cited

U.S. PATENT DOCUMENTS 5,739,730 A 4/1998 Rotzoll
5,994,982 A 11/1999 Kintis et al.
6,621,365 B1 * 9/2003 Hallivuori et al. .......... 331/179

OTHER PUBLICATIONS

Korean Patent Abstracts –Publication No. 1020020083709, Published Nov. 4, 2002.

Patent Abstracts of Japan –Publication No. 2003–078348, Published Mar. 14, 2003.

* cited by examiner

Primary Examiner—David Mis
(74) Attorney, Agent, or Firm—Lowe Hauptman & Berner, LLP

(57) ABSTRACT

The present invention relates to a variable oscillation frequency resonance circuit and voltage controlled oscillator using the same, which includes an inductance element, frequency varying means, and oscillation band varying means. The oscillation band varying means is provided with one or more capacitance element pairs and one or more differential switching element pairs each being arranged between capacitance elements of each of the capacitance element pairs, with differential switching elements of each of the differential switching element pairs being arranged in parallel with each other, to allow a corresponding capacitance element pair to be connected to the inductance element in response to second control signals.

4 Claims, 9 Drawing Sheets

A:(3G 25.9996m) delta:(-2G -14.7652m)
B:(1G 11.2344m) slope:7.3862p

A:(3G 32.5926m) delta:(-2G -21.6093m)
B:(1G 10.9833m) slope:10.8047p

US 6,882,233 B2

1

VARIABLE OSCILLATION FREQUENCY RESONANCE CIRCUIT AND VOLTAGE CONTROLLED OSCILLATOR USING THE SAME

BACKGROUND OF THE INVENTION

1. Field of the Invention

The present invention relates generally to an oscillator for generating frequencies ranging over a wide-band and, more particularly to a variable oscillation frequency resonance circuit and voltage controlled oscillator using the same, which increases the quality factor of the resonance circuit and improves phase noise characteristics by reducing the impedance of switching elements at the time of selecting an oscillation band.

2. Description of the Prior Art

Generally, an oscillator generates a signal with a specific frequency in an electrical circuit. As shown in FIG. 1, an oscillator is generally comprised of a resonance circuit 11 for resonating with a signal with a specific frequency, and an amplifying circuit 12 for continuously supplying the signal with the specific frequency resonated by the resonance circuit 11. Further, the resonance circuit for determining the specific frequency is implemented by an LC circuit in which an inductance element (coil) and a capacitance element (capacitor) of electrical circuit elements are combined. In this case, the oscillation frequency is determined by the inductance L and the capacitance C of the resonance circuit, so it can be varied by changing the inductance L or capacitance C of the resonance circuit. For example, the oscillation frequency is varied by varying capacitance using a variable capacitance element, such as a varactor diode, and a variable capacitance range of the varactor diode corresponds to a variable frequency range.

A narrow-band oscillator can be implemented by only a variable capacitance element, such as the varactor diode. However, a receiver of a television (TV) system for receiving airwave broadcasting signals, or other multi-band receivers require wide-band oscillators capable of varying frequencies over a wide-band.

FIG. 2 is a circuit diagram showing an example of a variable oscillation frequency resonance circuit provided in the wide-band oscillator which can be used in the receiver of the TV system or the multi-band receivers. In this case, the resonance circuit is constructed in such a way that an inductance element L21, a fine frequency adjusting unit 21 consisting of two varactor diodes VD21 and VD22, connected in series with each other and having capacitances varied in response to a control signal Vctrl, and a band selecting unit 20 consisting of a plurality of capacitance elements and a plurality of switching elements and having a capacitance varied by ON/OFF operations of the plural switching elements performed in response to externally applied switching control signals $V_{SW1}$ to $V_{SWn}$, are connected in parallel with each other between output terminals A and B connected to the amplifying circuit 12.

In the resonance circuit, a resonance frequency (oscillation frequency) is determined by the sum of capacitances of the two varactor diodes determined in response to the control signal Vctrl and the capacitance of the band selecting unit 20 determined in response to the switching control signals $V_{SW1}$ to $V_{SWn}$, and the inductance of the inductance element L21.

More specifically, each of the varactor diodes VD21 and VD22 of the fine frequency adjusting unit 21 has an internal

2 capacitance value $C_{VAR}$ linearly increased with the increase of a voltage level of the control signal Vctrl, as shown in FIG. 3a. That is, with the variation of the control signal Vctrl, the capacitance value of each of the varactor diodes VD21 and VD22 is continuously varied.

Further, the band selecting unit 20 is constructed in such a way that a plurality of capacitance elements are arranged in parallel with each other, and respective capacitance elements are connected in parallel with the output terminals A and B through the plural switching elements, thus switching capacitance elements connected to the output terminals A and B through the ON/OFF operations of the switching elements. Therefore, in the band selecting unit 20, a capacitance value is determined depending on capacitance elements connected to turned on switching elements. The capacitance value selected by the band selecting unit 20 is discontinuously varied in response to the switching control signals $V_{SW1}$ to $V_{SWn}$ for controlling the ON/OFF operations of the switching elements, as shown in FIG. 3b.

Accordingly, one of a plurality of oscillation bands as shown in FIG. 3b is selected by adjusting the switching control signals $V_{SW1}$ to $V_{SWn}$, and an oscillation frequency is determined within the selected oscillation band by adjusting the control signal Vctrl.

For example, if the number of cases of capacitance values selectable by the switching control signals $V_{SW1}$ to $V_{SWn}$ of the band selecting unit 20 is four, as shown in FIG. 3b, one of four bands successively connected as shown in FIG. 3c is selected by the switching control signals $V_{SW1}$ to $V_{SWn}$, and the determination of a fine frequency within the selected band is carried out through the control of varactor diodes VD21 and VD22 using the control signal Vctrl.

Through the above construction of the resonance circuit, wide-band frequency oscillation necessary for a receiver of a TV system or other wide-band receivers is realized.

In this case, the construction of the conventional band selecting unit 20 is depicted in FIG. 4.

An example of a frequency varying circuit of the conventional band selecting unit 20 is described with reference to FIG. 4. The frequency varying circuit is constructed in such a way that drains of first to sixth switching transistors M41 to M46 are commonly connected to the output terminals A or B connected to the amplifying circuit 12, first to sixth capacitors C41 to C46 are connected between sources of the first to sixth transistors M41 to M46 and the ground, respectively, gates of the first to sixth transistors M41 to M46 are connected to each other in pairs, and first to third control signal input terminals $V_{SW1}$ to $V_{SW3}$ are connected to the connected three pairs of gates, respectively.

In the above construction, low or high level signals are applied to the first to third control signal input terminals $V_{SW1}$ to $V_{SW3}$, and ON/OFF characteristics of the first to sixth switching transistors M41 to M46 are determined by the low or high level signals. For example, provided that the first to sixth transistors M41 to M46 are NMOS transistors in the circuit of FIG. 4, a first-second switching transistor pair M41–M42, a third-fourth switching transistor pair M43–M44, and a fifth-sixth switching transistor pair M45–M46 are turned on if high level voltage signals are applied to the first to third control signal input terminals $V_{SW1}$ to $V_{SW3}$, while they are turned off if low level voltage signals are applied thereto. On the contrary, provided that the first to sixth switching transistors M41 to M46 are PMOS transistors, the above transistor pairs are turned on if low level voltage signals are applied to the first to third control signal input terminals $V_{SW1}$ to $V_{SW3}$, while they are turned off if high level voltage signals are applied thereto.

Further, the capacitor pairs C41–C42, C43–C44, and C45–C46 connected to the output terminals A and B through the switching transistors in FIG. 4 have different capacitances. A corresponding capacitor pair is connected to the inductance element L21 through the output terminals A and B to form a resonance circuit when corresponding transistors M41 to M46 connected to the control signal input terminals $V_{SW1}$ to $V_{SW3}$ are turned on.

Therefore, values applied to the first to third control signal input terminals $V_{SW1}$ to $V_{SW3}$ are varied, thus enabling the total number of cases of capacitance values connected to the output terminals A and B to be varied up to seven.

As described above, a capacitance value determined by the variation of control values applied to the first to third control signal input terminals $V_{SW1}$ to $V_{SW3}$ is connected to the varactor diodes VD21 and VD22 of FIG. 2, thereby determining the frequency of the resonance circuit 11.

However, the switching transistors M41 to M46 each have a predetermined resistance when they are turned on. Moreover, especially in the construction of FIG. 4, the switching transistors M41 to M46 are connected in series with the capacitors C41 to C46, respectively, so the quality factor Q of the resonance circuit unit is reduced due to the sum of resistances of the switching transistors M41 to M46.

$$Q = \frac{Im(z)}{Re|z|} \quad [1]$$

Specifically, as indicated in Equation [1], the quality factor Q is represented by the ratio of reactance Im(z) to resistance Re|z| in the resonance circuit. As the quality factor Q increases, phase noise characteristics are improved.

However, in the conventional construction as shown in FIG. 4, two switching transistors connected as one pair on the basis of the output terminals A and B are connected in series with respective capacitors, so the total resistance Re|z| is increased to deteriorate the quality factor Q. Further, phase noise characteristics may be deteriorated due to the deterioration of the quality factor Q.

SUMMARY OF THE INVENTION

Accordingly, the present invention has been made keeping in mind the above problems occurring in the prior art, and an object of the present invention is to provide a variable oscillation frequency resonance circuit and voltage controlled oscillator using the same, which reduces resistance within a resonance circuit in a voltage controlled oscillator for oscillating at frequencies in a wide-band, thus improving high frequency characteristics, and increasing the quality factor to improve phase noise characteristics.

In order to accomplish the above object, the present invention provides a variable oscillation frequency resonance circuit of a voltage controlled oscillator, comprising an inductance element having a predetermined inductance value; frequency varying means connected in parallel with the inductance element and comprised of one or more varactor diode pairs each having a capacitance value varied in response to a first control signal to finely adjust the oscillation frequency; and oscillation band varying means provided with one or more capacitance element pairs each having a predetermined capacitance value and one or more differential switching element pairs each being arranged between capacitance elements of each of the capacitance element pairs, with differential switching elements of each of the differential switching element pairs being arranged in parallel with each other, to allow a corresponding capacitance element pair to be connected to the inductance element in response to second control signals.

Further, in the variable oscillation frequency resonance circuit, each of the differential switching element pairs of the oscillation band varying means is a field effect transistor pair in which drains of field effect transistors are connected to a corresponding capacitance element pair, sources thereof are connected to ground, the field effect transistors are cross-coupled at the drains and sources, and the second signals are applied to gates thereof.

Further, in the variable oscillation frequency resonance circuit, the oscillation band varying means further includes one or more bias resistor pairs used to connect contact points of the capacitance element pairs and the differential switching element pairs corresponding thereto to the ground.

In addition, the present invention provides a voltage controlled oscillator comprising the variable oscillation frequency resonance circuit having the above construction.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, a variable oscillation frequency resonance circuit and voltage controlled oscillator using the same according to embodiments of the present invention will be described in detail with reference to the attached drawings.

Figure 1:
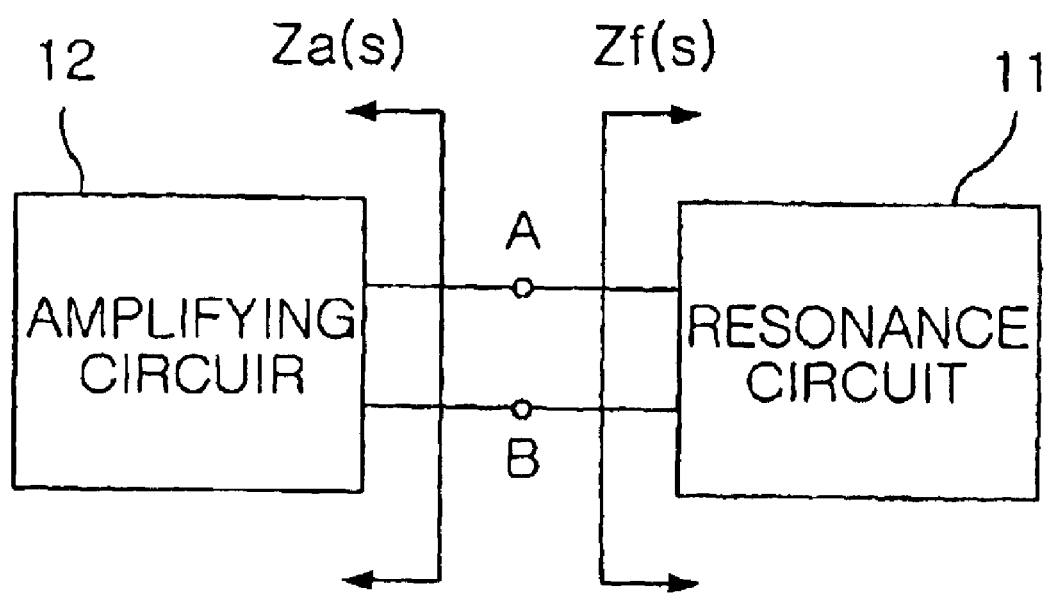
FIG. 1 is a block diagram showing the basic construction of an oscillator.
Figure 2:
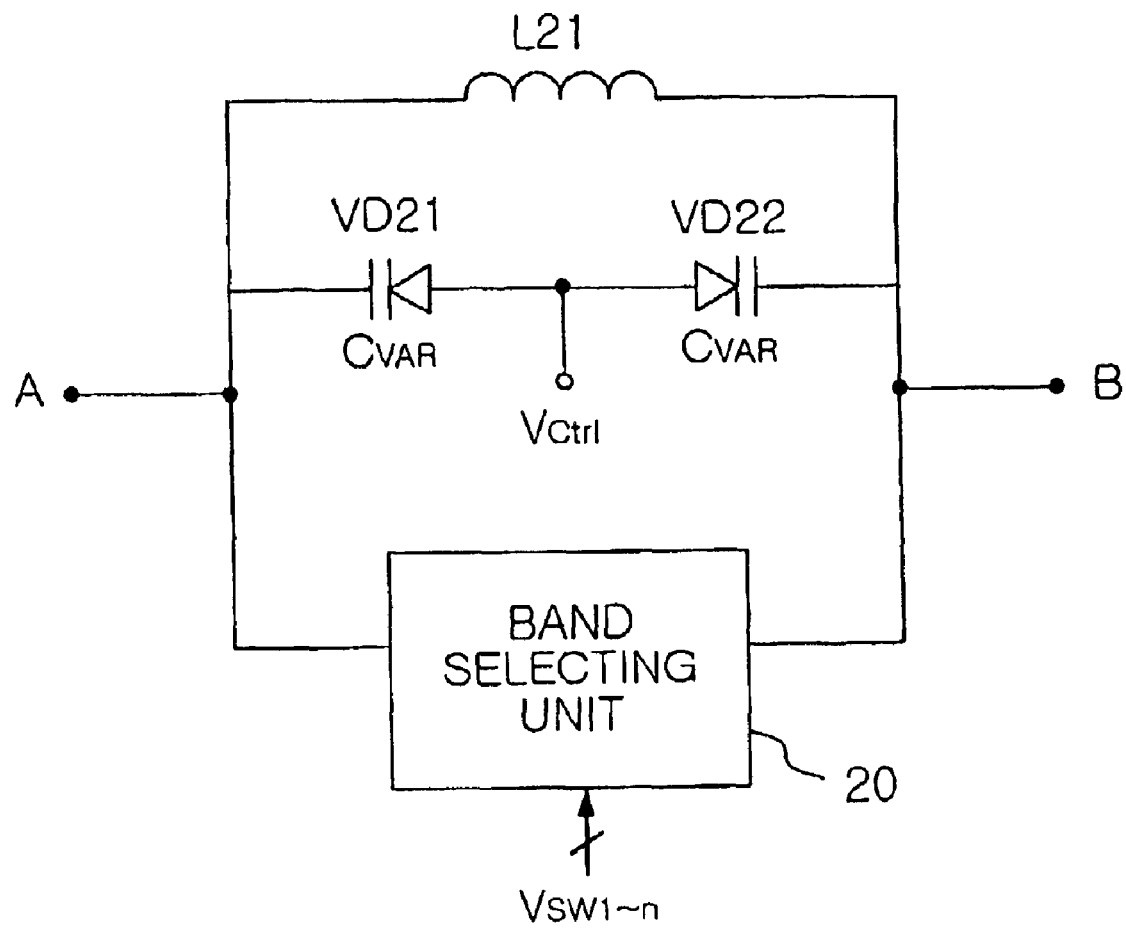
FIG. 2 is a circuit diagram showing the detailed construction of a variable oscillation frequency resonance circuit in a wide-band voltage controlled oscillator.
Figure 3A:
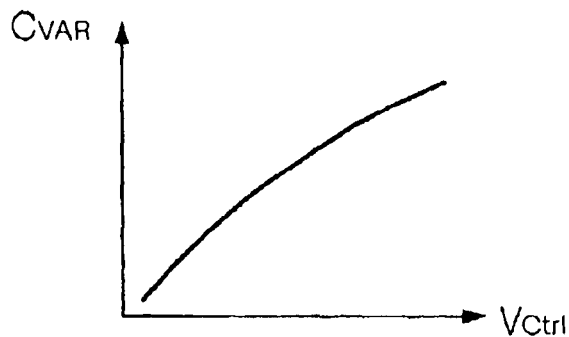
FIG. 3a is a graph showing operating characteristics of varactor diodes provided in the variable oscillation frequency resonance circuit of FIG. 2 according to a control signal.
Figure 3B:
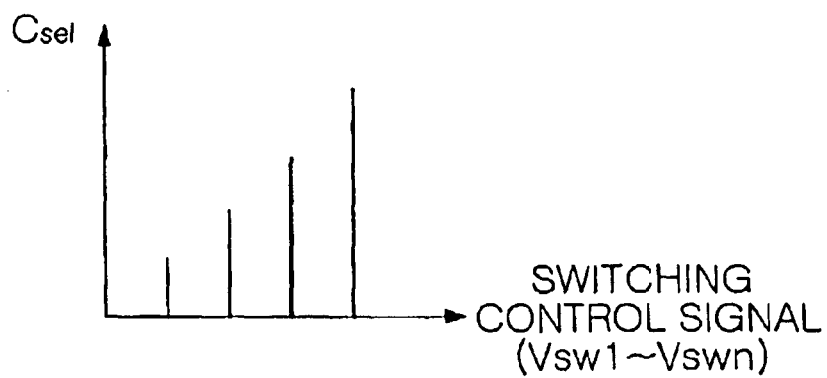
FIG. 3b is a graph showing operating characteristics of a band selecting unit in the variable oscillation frequency resonance circuit of FIG. 2 according to control signals.
Figure 3C:
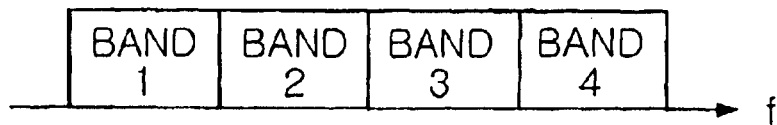
FIG. 3c is a view showing oscillation frequency bands of the variable oscillation frequency resonance circuit of FIG. 2.
Figure 5:
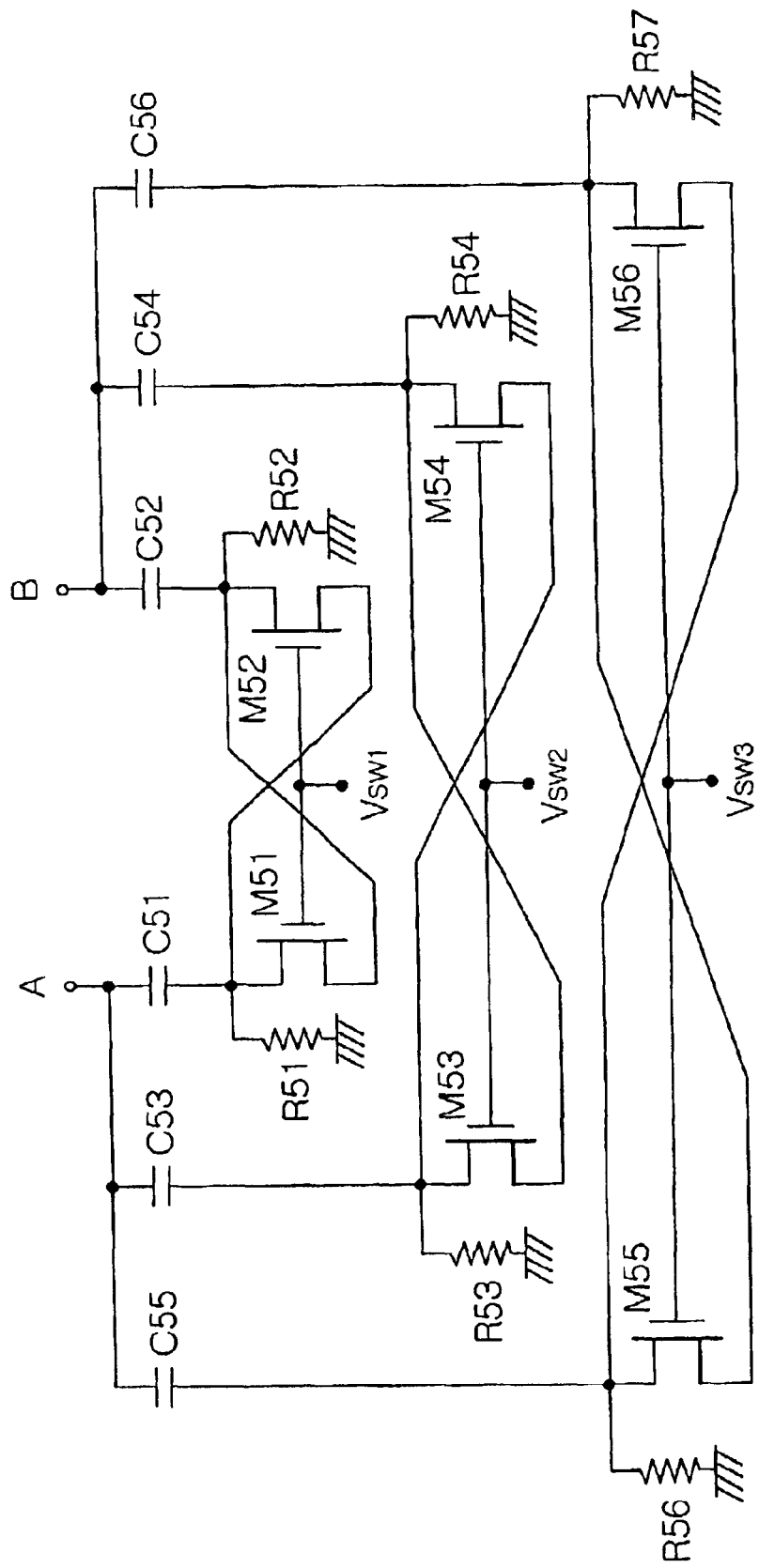
FIG. 5 is a circuit diagram showing a band selecting unit of an improved variable oscillation frequency resonance circuit according to the present invention.

FIG. 5 is a circuit diagram of an oscillation frequency varying circuit according to an embodiment of the present invention. The circuit comprises a plurality of capacitance element pairs C51–C52, C53–C54 and C55–C56, a plurality of differential switching element pairs M51–M52, M53–M54 and M55–M56, and a plurality of first and second resistor pairs R51–R52, R53–R54, and R55–R56. The capacitance element pairs C51–C52, C53–C54 and C55–C56 have one ends connected to the output terminal A or B connected to the inductance element L21 in the amplifying circuit 12 as shown in FIG. 1 and the resonance circuit 11 as shown in FIG. 2. The differential switching element pairs M51–M52, M53–M54 and M55–M56 are each arranged between two capacitance elements of each of capacitance element pairs C51–C52, C53–C54 and C55–C56, with two switching elements of each of the differential switching element pairs M51–M52, M53–M54 and M55–M56 being arranged in parallel with each other. Further, the differential switching element pairs M51–M52, M53–M54 and M55–M56 are switched on/off in response to first to third control signals $V_{SW1}$ to $V_{SW3}$ to allow corresponding capacitance element pairs C51–C52, C53–C54 and C55–C56 to be connected or disconnected to or from the output terminals A and B. The first and second resistor pairs R51–R52, R53–R54, and R55–R56 are used to connect contact points of the differential switching element pairs M51–M52, M53–M54 and M55–M56 and the capacitance element pairs C51–C52, C53–C54 and C55–C56 to the ground.

The first to third control signals $V_{SW1}$ to $V_{SW3}$ are low or high level voltage signals, and the differential switching element pairs M51–M52, M53–M54 and M55–M56 are operated to be switched on/off in response to the first to third control signals $V_{SW1}$ to $V_{SW3}$, respectively. For example, provided that the switching elements are implemented by NMOS transistors in the embodiment of FIG. 5, the differential switching element pairs M51–M52, M53–M54 and M55–M56 are turned off if low level voltage signals are applied as the first to third control signals $V_{SW1}$ to $V_{SW3}$, while they are turned on if high level voltage signals are applied as the first to third control signals $V_{SW1}$ to $V_{SW3}$. Further, provided that the switching elements of FIG. 5 are implemented by PMOS transistors, the differential switching element pairs are operated contrary to the above case.

Further, through the above on/off switching operations, the differential switching element pair M51–M52 allows the capacitance element pair C51–C52 to be connected or disconnected to or from the output terminals A and B, the differential switching element pair M53–M54 allows the capacitance element pair C53–C54 to be connected or disconnected to or from the output terminals A and B, and the differential switching element pair M55–M56 allows the capacitance element pair C55–C56 to be connected or disconnected to or from the output terminals A and B.

That is, capacitance elements of a corresponding capacitance element pair are connected in series with the output terminals A and B and the ground between the output terminals A and B and the ground, respectively, through a turned-on differential switching element pair.

In this case, the first and second resistor pairs R51–R52, R53–R54 and the R55–R56 are bias resistor pairs.

Therefore, the number of cases for switching control of the differential switching element pairs M51–M52, M53–M54 and M55–M56 may be seven by the combination of the first to third control signals $V_{SW1}$ to $V_{SW3}$. Further, if the capacitance values of the capacitance elements C51 to C56 are varied, the number of selectable capacitances may be seven. For example, if the total capacitance of the capacitance element pair C51–C52 is 1 pF, the total capacitance of the capacitance element pair C53–C54 is 2 pF, and the total capacitance of the capacitance element pair C55–C56 is 4 pF, capacitances, such as 1 pF, 2 pF, 3 pF, 4 pF, 5 pF, 6 pF and 7 pF, can be obtained through the combination of the capacitance values, depending on the switching control of the differential switching element pairs M51–M52, M53–M54 and M55–M56.

In this case, the number of selectable capacitances can be more increased by increasing the number of circuits each consisting of a capacitance element pair, a differential switching element pair, and a first and second resistor pair.

Such differential switching element pairs M51–M52, M53–M54, and M55–M56 are constructed in such a way that switching elements of each pair are cross-coupled at their drains and sources, and if the switching elements thereof are turned on in response to each of the first to third control signals $V_{SW1}$ to $V_{SW3}$, switching elements of each pair are connected in parallel with each other between capacitance elements of each of the capacitance element pairs C51–C52, C53–C54 and C55–C56. Therefore, the resistance of the circuit is reduced, so the quality factor Q as indicated in Equation [1] is increased.

An example of an operation of the oscillation frequency varying circuit having the above construction is described in detail with reference to FIGS. 6a and 6b.

Figure 6A:
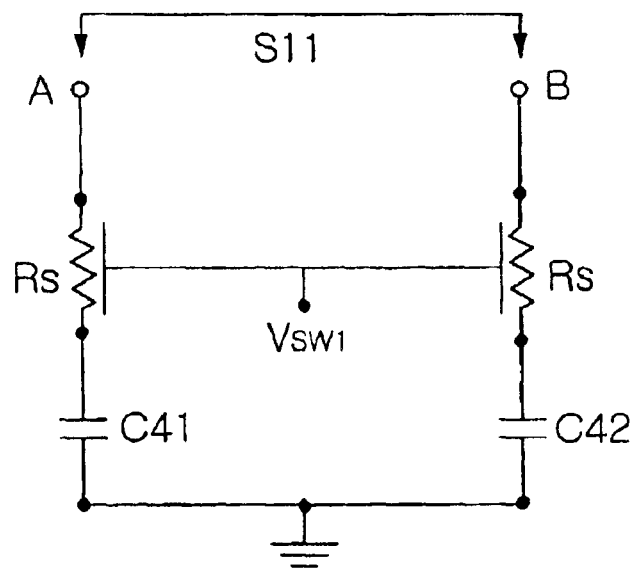
FIG. 6a is an equivalent circuit of the conventional band selecting unit and FIG. 6b is an equivalent circuit of the band selecting unit of the present invention.
Figure 6B:
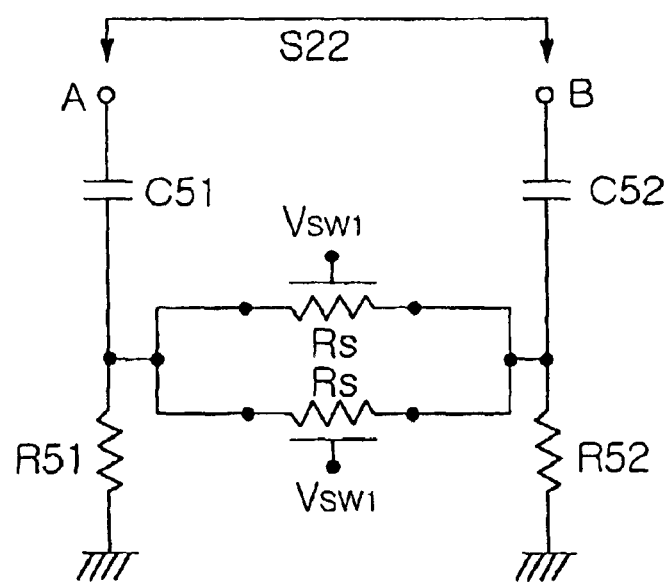

FIG. 6a is an equivalent circuit of one capacitance element pair C41–C42 and one switching element pair M41–M42 connected thereto when the switching element pair M41–M42 is turned on in the conventional band selecting unit for varying an oscillation frequency, and FIG. 6b is an equivalent circuit of one capacitance element pair C51–C52 and the differential switching element pair M51–M52 connected thereto when the differential switching element pair M51–M52 is turned on in the band selecting unit of the present invention. FIGS. 6a and 6b are compared with each other and described in detail.

Figure 4:
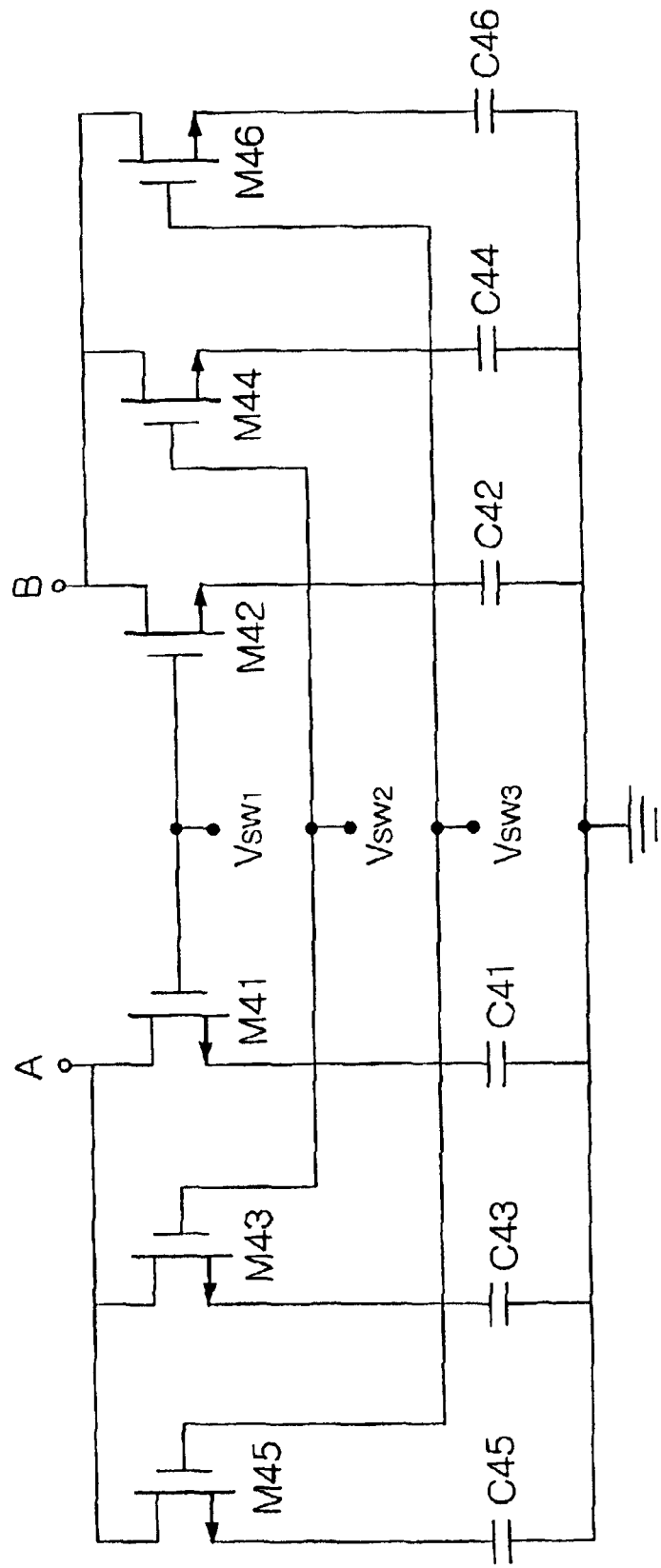
FIG. 4 is a circuit diagram showing the conventional construction of the band selecting unit in the variable oscillation frequency resonance circuit of FIG. 2.

In the case of the conventional circuit of FIG. 4, if a high level voltage is applied as the first control signal $V_{SW1}$ and so the switching element pair M41–M42 is turned on, the equivalent circuit implemented on the basis of the output terminals A and B is shown in FIG. 6a. In the above equivalent circuit, $R_S$ is the impedance of each of the switching elements M41 and M42. That is, two resistors $R_S$ are connected in series with the capacitance elements C41 and C42, respectively, which are connected between the output terminals A and B and the ground, respectively. In this equivalent circuit, impedance Z is obtained by the following Equation [2], $$Z = 2R_S + \frac{2}{j\omega C} \quad [2]$$

where reference numeral C is the total capacitance value of the capacitance element pair C41–C42. Referring to Equation [2], reactance Im (z) is $$\frac{2}{\omega C},$$

and resistance Re(z) is $2R_S$ in the circuit of FIG. 6a.

Next, in the case of the present invention of FIG. 5, if a high level voltage is applied as the first control signal $V_{SW1}$ and so the switching element pair M51–M52 is turned on, the equivalent circuit implemented on the basis of the output terminals A and B is shown in FIG. 6b. In the equivalent circuit, $R_S$ is the impedance of each of the switching elements M51 and M52. That is, two resistors $R_S$ are connected in parallel with each other between the capacitance elements C51 and C52 which are respectively connected in series with the output terminals A and B and the ground between the output terminals A and B and the ground. Further, in such an equivalent circuit, the total resistance R is $$\frac{1}{R} = \frac{1}{R_S} + \frac{1}{R_S},$$

so the impedance of the circuit is obtained by the following Equation [3], $$Z = \frac{R_S}{2} + \frac{2}{j\omega C} \quad [3]$$

where C is the total capacitance of the capacitance element pair C51–C52.

Consequently, since switching elements of each switching element pair are parallel with each other in the present invention, the resistance, which was $2R_S$ in the conventional circuit, is reduced to $R_S/2$ as indicated in Equation [3]. That is, the resistance is reduced to ¼ of that of the conventional circuit. Accordingly, if the quality factor Q is predicted from the reduction of the resistance, the quality factor Q is increased to be approximately four times that of the conventional circuit, because only resistance is reduced to ¼ of that of the conventional circuit when the reactance is the same as that of the conventional circuit.

That is, if the oscillation frequency varying circuit of the present invention is used, the quality factor Q is increased to be greater than four times that of the conventional circuit while the same switching elements as those of the conventional circuit are used, thus improving the quality factor through simple structural modification without increasing the size of switching elements.

The advantages of the oscillation frequency varying circuit of the present invention can be more accurately described through simulation results shown in FIGS. 7a to 7c to FIGS. 9a to 9c.

Figure 7A:
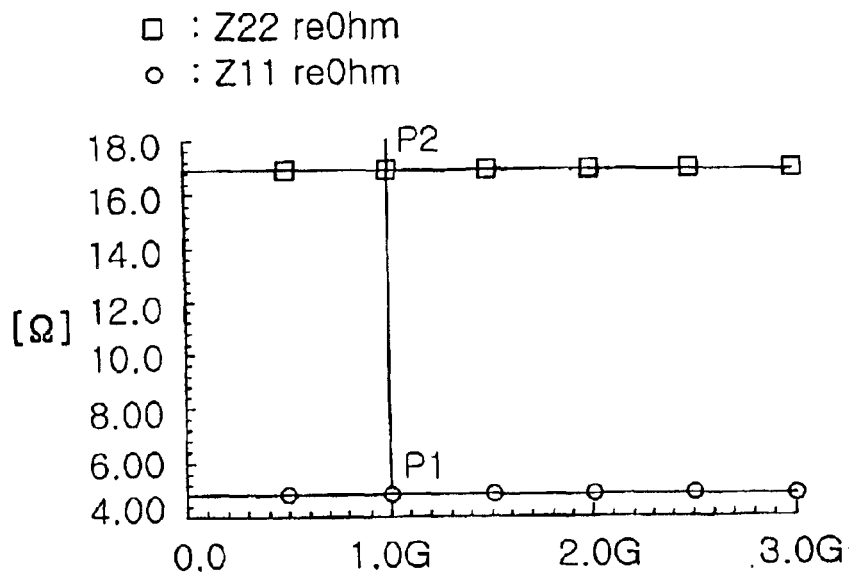
FIG. 7a is a graph showing results obtained by comparing resistances Re(z) of the conventional band selecting unit and the band selecting unit of the present invention with each other under the same conditions.
Figure 7B:
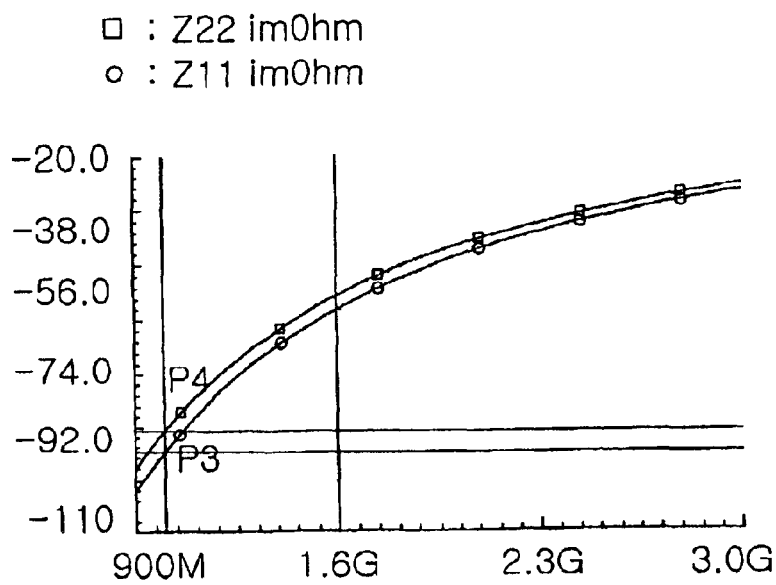
FIG. 7b is a graph showing results obtained by comparing quality factors thereof with each other.

FIG. 7a is a graph showing results obtained by comparing resistances Re(z) of the conventional oscillation frequency varying circuit and the oscillation frequency varying circuit of the present invention with each other under the same conditions, and FIG. 7b is a graph showing results obtained by comparing quality factors Q thereof with each other.

In experiments of FIGS. 7a and 7b, the same switching elements and capacitance elements were used. Referring to FIG. 7a, if only resistances at the frequency of 1 GHz are compared with each other, the resistance of the oscillation frequency varying circuit of the present invention was approximately 4 Ω (P1), while the resistance of the conventional oscillation frequency varying circuit was approximately 16 Ω (P2). Therefore, it can be proved that there is a difference of approximately four times between the resistances of present invention and the prior art. Moreover, if quality factors at the frequency of 1 GHz are compared with each other with reference to FIG. 7b, it can be seen that the quality factor Q (P3) of the present invention is greater than the quality factor Q (P4) of the prior art.

Figure 8A:
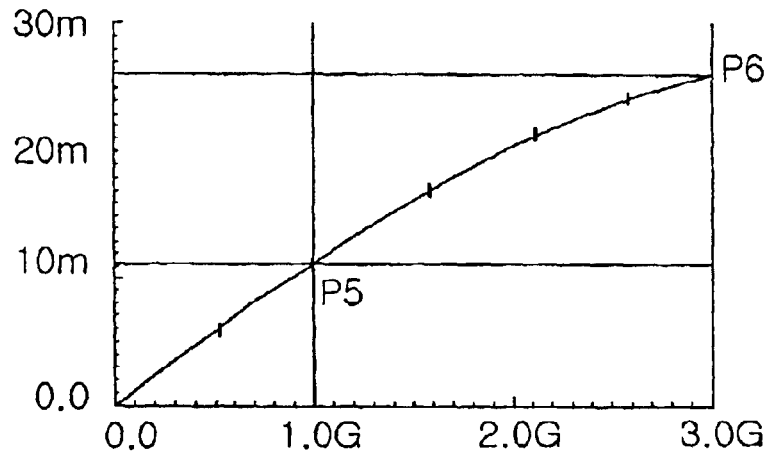
FIG. 8a is a graph showing results obtained by measuring the variation of capacitance to the variation of frequency in a 1 GHz frequency band in the conventional band selecting unit and FIG. 8b is a graph showing results obtained by measuring the variation of capacitance to the variation of frequency in the 1 GHz frequency band in the band selecting unit of the present invention.
Figure 8B:
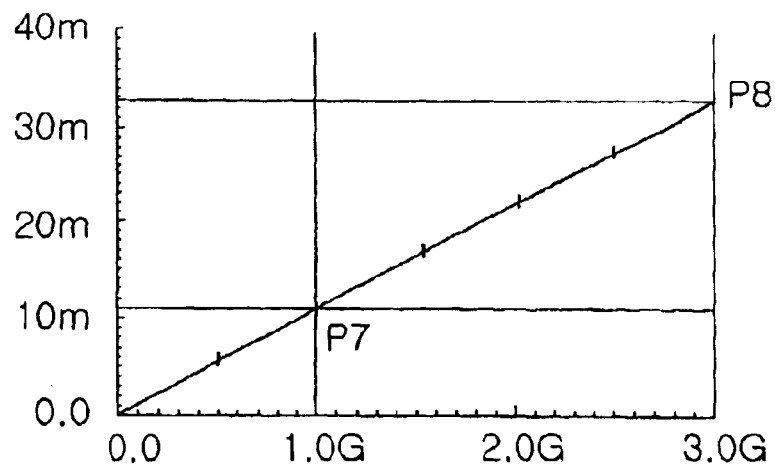

Next, FIGS. 8a and 8b are graphs comparing the variation of capacitance to the variation of frequency of the prior art and the present invention, respectively. As shown in FIG. 8a, the variation of capacitance to the variation of frequency is non-linear in the prior art. If capacitance (P6) at the frequency of 3 GHz is compared with capacitance (P5) at the frequency of 1 GHz, capacitance is reduced to 77%. On the contrary, as shown in FIG. 8b, the variation of capacitance to the variation of frequency is approximately linear in the present invention. If capacitance (P8) at the frequency of 3 GHz is compared with capacitance (P7) at the frequency of 1 GHz, capacitance is hardly changed and maintained at 99%.

Even though a frequency band is expanded to 10 GHz and the variation of capacitance to the variation of frequency is measured, approximately similar capacitance variation characteristics were obtained.

Figure 9A:
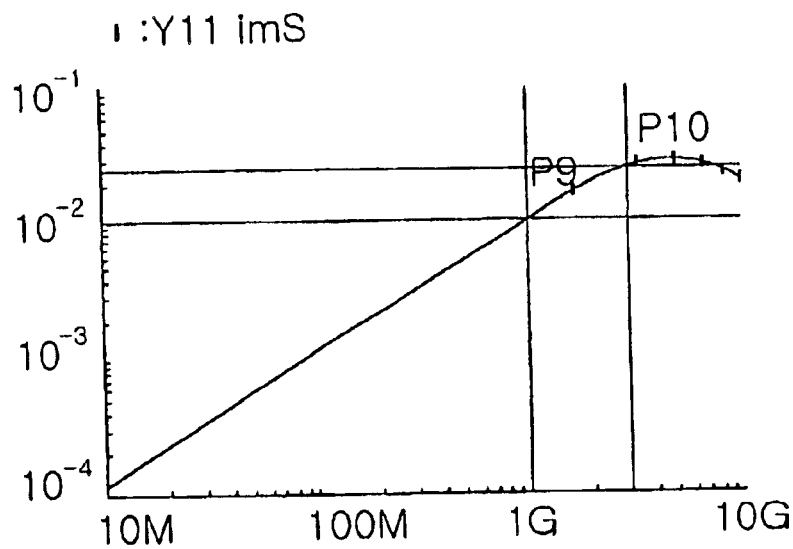
FIG. 9a is a graph showing results obtained by measuring the variation of capacitance to the variation of frequency up to 10 GHz in the conventional band selecting unit.
Figure 9B:
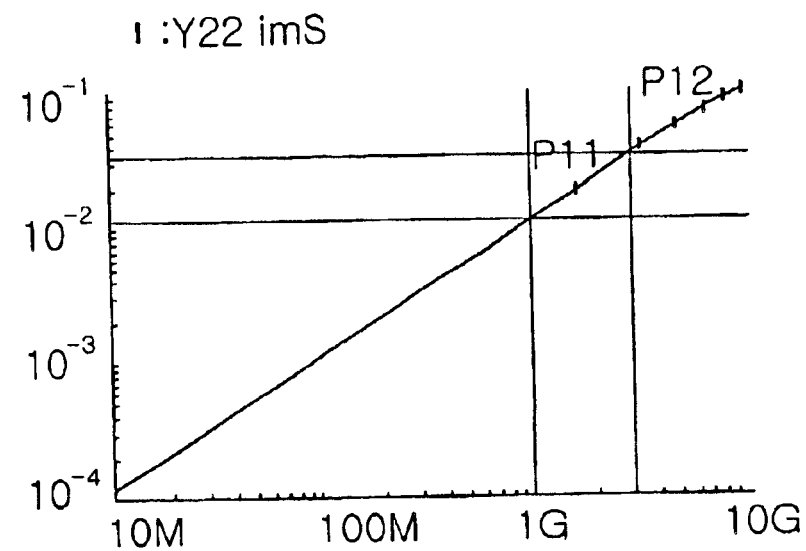
FIG. 9b is a graph showing results obtained by measuring the variation of capacitance to the variation of frequency up to 10 GHz in the band selecting unit of the present invention.

That is, FIGS. 9a and 9b are graphs comparing the variation of capacitance to the variation of frequency up to 10 GHz of the prior art and the present invention, respectively, in the log scale. Referring to FIG. 9a, in the conventional circuit, capacitance drops remarkably with the increase of frequency. On the contrary, referring to FIG. 9b, the circuit of the present invention is relatively uninfluenced by frequency.

Therefore, it can be seen that the oscillation frequency varying circuit of the present invention also has improved frequency characteristics compared to the conventional circuit.

As described above, the present invention provides a variable oscillation frequency resonance circuit and voltage controlled oscillator using the same, which can increase the quality factor Q to be greater than four times that of a conventional circuit if the same switching elements as those of the conventional circuit are used, and remarkably decrease phase noise through the improvement of the quality factor. Further, the present invention is advantageous in that it can improve the quality factor through simple structural modification without increasing the size of switching elements.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A variable oscillation frequency resonance circuit of an oscillator for determining an oscillation frequency by inductance and capacitance, comprising:

an inductance element having a predetermined inductance value;

frequency varying means connected in parallel with the inductance element and comprised of one or more varactor diode pairs each having a capacitance value varied in response to a first control signal to finely adjust the oscillation frequency; and oscillation band varying means provided with one or more capacitance element pairs each having a predetermined capacitance value and one or more differential switching element pairs each being arranged between capacitance elements of each of the capacitance element pairs, with differential switching elements of each of the differential switching element pairs being arranged in parallel with each other, to allow a corresponding capacitance element pair to be connected to the inductance element in response to second control signals.

2. The variable oscillation frequency resonance circuit of an oscillator according to claim 1, wherein each of the differential switching element pairs of the oscillation band varying means is a field effect transistor pair in which drains of field effect transistors are connected to a corresponding capacitance element pair, sources thereof are connected to ground, the field effect transistors are cross-coupled at the drains and sources, and the second signals are applied to gates thereof.

3. The variable oscillation frequency resonance circuit of an oscillator according to claim 1, wherein the oscillation band varying means further includes one or more bias resistor pairs used to connect contact points of the capacitance element pairs and the differential switching element pairs corresponding there to the ground.

4. A voltage controlled oscillator, comprising:
   the variable oscillation frequency resonance circuit of any of claim 1.

* * * * *